United States Patent [19]

Wollman

[11] Patent Number: 4,488,144
[45] Date of Patent: Dec. 11, 1984

[54] HIGH LINEARITY DIGITAL TO ANALOG CONVERTER

[75] Inventor: Herbert Wollman, Burlington, Mass.

[73] Assignee: Analogic Corporation, Wakefield, Mass.

[21] Appl. No.: 481,014

[22] Filed: Apr. 1, 1983

Related U.S. Application Data

[63] Continuation of Ser. No. 145,629, May 1, 1980, abandoned.

[51] Int. Cl.³ ............................................. H03K 13/02
[52] U.S. Cl. ...................... 340/347 DA; 340/347 CC; 340/347 M; 363/124; 330/9
[58] Field of Search .... 340/347 M, 347 DA, 347 CC; 307/262; 363/124; 330/9

[56] References Cited

U.S. PATENT DOCUMENTS 3,516,002 6/1970 Hillis ............................ 340/347 CC
3,582,939 6/1971 Campbell ...................... 340/347 DA
4,298,843 11/1981 Nixon ..................................... 330/9

OTHER PUBLICATIONS

Hellwarth et al., Differential Automatic Zero—Correction Amplifier, IBM Tech. Disclosure Bulletin, vol. 15, No. 9, 2/1973, pp. 2719-2720.
Wittlinger et al., Dual Variable OP—AMP IC Simplifies Complex Analog Designs, EDN., Sep. 5, 1979, 5 pp.
The Engineering Staff of Analog Devices, Inc., Analog—Digital Conversion Handbook, 6/1972, pp. I-2 to I-4; I-54 to I-61; II-32 to II-45.
Applications & Engineering Staffs of Burr-Brown Research Corp., Operational Amplifiers Design and Applications, McGraw—Hill Book Co., 1975, pp. 150-161.
Wait et al., Introduction to Operational Amplifier Theory and Applications, McGraw—Hill Book Co., 1975, p. 107.

Primary Examiner—T. J. Sloyan
Attorney, Agent, or Firm—Weingarten, Schurgin, Gagnebin & Hayes

[57] ABSTRACT

A digital-to-analog converter having high linearity about zero utilizes a magnitude/sign input code and comprises in combination a single unipolar digital-to-analog converter, a broad bandwidth, offset compensated amplifier and a circuit which multiplies the output of this amplifier by +1 or −1 depending on the sign code.

4 Claims, 14 Drawing Figures

PRIOR ART DUAL D/A

PRIOR ART DUAL CA D/A

PRIOR ART OFFSET BINARY

ZERO
100

+LSB
101

−LSB
011

HIGH LINEARITY DIGITAL TO ANALOG CONVERTER

This application is a continuation of application Ser. No. 145,629, filed May 1, 1980, abandoned.

FIELD OF INVENTION

This invention relates to a digital-to-analog conversion system in which a high degree of linearity is achieved in the production of a bipolar analog signal.

BACKGROUND OF THE INVENTION

Digital-to-Analog Converters (DACs) have been used in the past to convert a series of digital signals into a corresponding analog signal. DACs are widely used wherever a digital signal is required to produce an analog voltage or current, and also as a major section of many successive approximation types of Analog-to-Digital Converters (ADCs). Specific examples are digitizers for professional quality audio signals, converters for the telephone industry and digitizers for seismology signals. In each case the system must handle peak input signals many times its normal operating range, yet linearity is of greatest concern when the input signal is of low amplitude.

There thus exists a large and important class of applications which require highly linear digital-to-analog conversion with low level signals. In the past, there have been two problems with the vast majority of commercially available high speed offset binary converters. First, for "center scale" offset binary converters, those that produce bipolar analog signals shifted about some center scale or offset voltage, they produce their largest non-linearities at center scale. This is because they use an offset binary or 2's complement input code in which the least significant bits (LSBs) about center scale are derived by matching one large resistance, the most significant bit (MSB) resistor, against another large resistance, the remainder of the resistors. Thus, error in any of the resistors produces a large error about center scale.

Secondly, for the "zero scale" offset binary converters in which a 10000 code is required to produce exactly zero analog voltage, not only is linearity about zero a problem, but also in the offset binary system, zero volts is obtained by bucking an offset current controlled by a large offset resistor against a current generated by the MSB resistor. Here again matching of two large resistances is required. Any mismatch results in unacceptable linearity.

In summary, for offset binary systems, the worst linearity occurs at its center code. In an offset binary application, the unipolar full scale is offset by half scale, which causes the worst code to fall at or near zero output voltage.

To avoid this problem, one approach in the past has been to use a "sign/magnitude" input code.

Sign/magnitude converters have included "dual" digital-to-analog conversion circuits, one provided with a positive reference voltage and the other supplied with a negative reference voltage. Two digital-to-analog converters are used so that a bipolar signal may be reproduced. By "bipolar" is meant a signal which has both positive and negative excursions about zero volts. These digital-to-analog converters contain a number of current sources, the outputs of which are summed at a summing node of an operational amplifier to convert the digital signals from precisely controlled current steps to precisely controlled voltage steps. For designs of this type, zero output is obtained by having all bits OFF. Non-zero outputs are obtained by turning ON some of the bits in one or the other of the DACs depending on whether positive or negative output is desired. Thus the sign/magnitude DAC is one in which two unipolar DACs are used, one to generate the positive going portion of the waveform and the other the negative. For 16 bit performance, the total system would have two separate 15 bit converters, one which produces positive output and one which produces a negative output, and provision for summing their outputs. The most significant bit, or sign bit input actuates logic to cause one of the DACs to be ON and the other OFF. For a code of one step above or below zero, only one least significant bit of one of the DACs is ON. All others are OFF, and hence the step size is just the weight of the LSB. The main disadvantages to this approach are primarily that it requires two matched DACs requiring twice the cost, power, size, etc. and also that it requires additional logic to turn on only the proper DAC.

A different type sign/magnitude DAC is one which includes a magnitude converter coupled to a low offset chopper stabilized amplifier which multiplies the output of the DAC by $\pm 1$, depending on the sign code. Thereafter the signal from the multiplier is amplified by an additional chopper stabilized amplifier. This type system is exemplified by the EDC Model 501 DAC in which sign switching occurs prior to amplification.

This approach has the obvious disadvantage of using two chopper stabilized amplifiers. The two amplifiers should also have matched low offsets to preserve linearity. While this type of system is useful for calibration instruments in which absolutely accurate voltage levels are required, the applications mentioned above do not require absolute accuracy but rather depend almost exclusively on linearity.

SUMMARY OF THE INVENTION

The subject invention eliminates the problems of the offset binary converters by utilizing a magnitude/sign code and solves the problems of the prior sign/magnitude converters by employing a system which utilizes only one offset-compensated amplifier, the magnitude amplifier, and by providing that sign multiplication take place after amplification. This takes advantage of the zero offset of a uni-polar DAC and preserves linearity with only one offset-compensated amplifier.

In accordance with this invention, a unipolar DAC is provided with a magnitude code. The output of the DAC is coupled through an offset-compensated amplifier to a $\pm 1$ multiplier controlled by the sign code. Thus, only one unipolar DAC is used to produce a voltage proportional to the magnitude of the desired output, and only one offset-compensated amplifier is used. The polarity of the output is then determined by a subsequent multiplier in the form of an operational amplifier, the gain of which is switchable between positive and negative. In this manner, performance equivalent to either of the two prior art sign/magnitude DACs is achieved with about half the total parts and complexity.

In one embodiment, the offset-compensated amplifier is in the form of a chopper stabilized amplifier which includes an auxiliary amplifier and a chopper circuit. This chopper circuit chops only the D.C. offset error of the magnitude amplifier, not the A.C. input signal, and produces an error signal which is fed back to the magnitude amplifier to cancel the offset. What is accomplished by this design is that the composite amplifying system retains the extremely wide bandwidth of the magnitude amplifier, which results in good overall system speed. In the subject invention the chopping of only the D.C. error signal is accomplished by providing an extremely high gain operational amplifier as the magnitude amplifier and sensing the voltage at its summing point or inverting input. Further signal rejection can be obtained by adding a very small percentage of the magnitude amplifier output voltage to the magnitude amplifier input voltage at the inverting input. This can be accomplished by a simple resistor network at the amplifier output.

As will be described immediately hereinafter, with the magnitude/sign approach and the digital-to-analog converter system described, a one-tenth bit error for the least significant bit may be achieved with inexpensive resistors, not only thereby achieving extremely low cost for digital-to-analog conversion, but also extremely high linearity of the conversion, especially about zero or center scale.

BRIEF DESCRIPTION OF THE DRAWING

These and other features of the present invention are more fully set forth below in the detailed description of the preferred embodiments presented below for purposes of illustration, not by way of limitation, and the accompanying drawing of which.

DETAILED DESCRIPTION

Figure 1A:
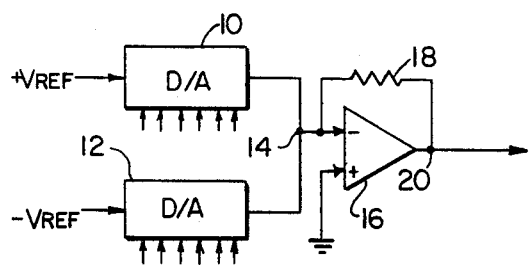
FIGS. 1A and 1B are block diagrams of prior art sign/magnitude digital-to-analog converter systems.

Referring now to FIG. 1A, as mentioned hereinbefore in the prior art, a sign/magnitude system may include a dual digital-to-analog converter having first and second digital-to-analog conversion units 10 and 12. Each of these units is provided with an appropriate digital word corresponding to the magnitude of the voltage to be produced. In order to simulate an analog signal, the digital signals to the conversion units change at the sample rate for the system.

As can be seen, digital-to-analog conversion unit 10 is provided with a plus reference voltage, $+V_R$, whereas the other digital-to-analog conversion unit 12 is provided with a minus reference voltage, $-V_R$. The outputs of these two conversion units are summed at a node 14 which is applied to one input terminal of an operational amplifier 16 having two input terminals. The other input terminal of the operational amplifier is grounded and the operational amplifier is provided with a feedback resistor 18 going from its output 20 to input node 14. The operation of this type of prior art dual digital-to-analog conversion system has been described before in that one DAC is turned on for positive going excursions of a signal, with the other for negative going excursions. It should be noted that in order to obtain a symmetric output signal, both digital-to-analog converters must be matched.

Figure 1B:
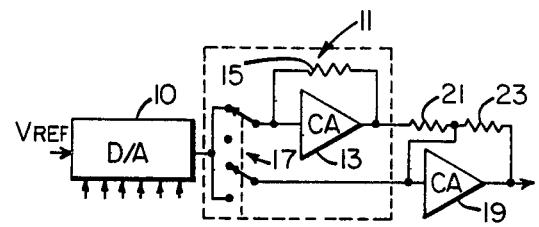

In FIG. 1B another type sign/magnitude converter is illustrated in which the same type digital-to-analog conversion unit 10 is coupled to a ±1 switching unit 11, which includes a conventional chopper stabilized amplifier 13 with feedback resistor 15. This amplifier inverts converter 10's output when amplifier 13 is switched via double pole double throw switch 17 to the output of converter 10. The output of amplifier 13 is coupled to an additional chopper stabilized amplifier 19 through resistor 21, with a resistor 23 forming a feedback resistor for amplifier 19. The input to amplifier 19 is also via switch 17.

In operation, for multiplying by +1, switch 17 is in the position shown. The signal from converter 10 is thus twice inverted to yield the original signal. For multiplying by -1, switch 17 is thrown to the opposite position such that the output of converter 10 is only inverted once. As illustrated, this system requires two chopper stabilized amplifiers and includes switching before amplification. While offsets are low, linearity depends on matched amplifiers and switching transients may be amplified.

Figure 2:
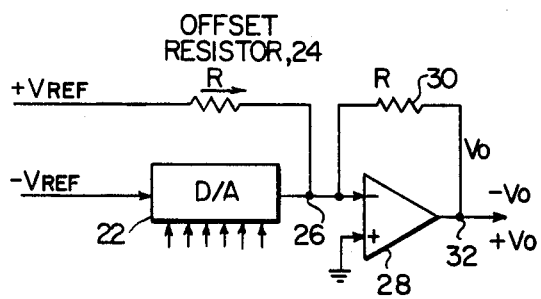
FIG. 2 is a block diagram of a prior art offset binary digital-to-analog conversion system.

With respect to FIG. 2, a prior art offset binary system is illustrated in which a digital-to-analog converter 22 is provided with a positive reference voltage, $+V_R$ and a negative reference voltage, $-V_R$. A coded word in offset binary form is applied to the switching circuits within the digital-to-analog converter (not shown in this diagram) such that the current sources within the digital-to-analog converter are appropriately switched to provide the current corresponding to the digital code. The following table sets out the offset binary code most often utilized.

TABLE I

| OFFSET BINARY CODE | | | | | |
|---|---|---|---|---|---|
| MSB | | | LSB | OUTPUT For 16 Bit | VOLTAGE General |
| B1 | B2 | B3 to $B_{BN-1}$ | BN | ±5 Volt | Equation |
| 1 | 1 | 1 | 1 | 4.999847 | FSR/2-LSB |
| 1 | 1 | 1 | 0 | 4.999695 | FSR/2-2LSB |
| 1 | 1 | 0 | 1 | +2.500153 | FSR/4+LSB |
| 1 | 1 | 0 | 0 | +2.500000 | FSR/4 |
| 1 | 0 | 1 | 1 | +2.499847 | FSR/4-LSB |
| 1 | 0 | 1 | 0 | +2.499695 | FSR/4-2LSB |
| 1 | 0 | 0 | 1 | +0.000153 | LSB |
| 1 | 0 | 0 | 0 | +0.000000 | 0 |
| 0 | 1 | 1 | 1 | -0.000153 | -LSB |

TABLE I-continued

| OFFSET BINARY CODE | | | | | |
|---|---|---|---|---|---|
| MSB B1 | B2 | B3 to $B_{BN-1}$ | LSB BN | OUTPUT For 16 Bit ±5 Volt | VOLTAGE General Equation |
| 0 | 1 | 1 | 0 | −0.000305 | −2LSB |
| 0 | 1 | 0 | 1 | −2.499847 | −FSR/4+LSB |
| 0 | 1 | 0 | 0 | −2.500000 | −FSR/4 |
| 0 | 0 | 1 | 1 | −2.500153 | −FSR/4-LSB |
| 0 | 0 | 1 | 0 | −2.500305 | −FSR/4-2LSB |
| 0 | 0 | 0 | 1 | −4.999847 | −FSR/2+LSB |
| 0 | 0 | 0 | 0 | −5.000000 | −FSR/2 |

In the embodiment illustrated, an offset resistor 24 is provided between $+V_R$ and an output node 26. For the "zero scale" case, it is the purpose of this offset resistor to provide an offset current so that when the current supplied by the digital-to-analog converter is converted to a voltage, the voltage may be swung above and below zero volts. Otherwise, the setting of resistor 24 may be arbitrary so as to set the system "zero" to a predetermined center scale point about which the voltage is swung.

As illustrated, output node 26 is coupled to one of two input terminals of an operational amplifier 28 having the other input terminal grounded. A feedback resistor 30 is positioned between the output 32 of the operational amplifier and the input 26.

Zero scale systems are configured such that the resistor value for the offset resistor results in a current through the offset resistor that is exactly offset by the current generated by the current source corresponding to the most significant bit. The full scale current for all of the bits is denoted by $I_{FSR}$, where FSR stands for Full Scale Range. Note that the current sources within the digital-to-analog converter are backed against a half scale offset $I_{FSR}/2$.

For center scale systems, at positive full scale, the current through the current source of the converter is twice as large as that through the half current offset resistor such that a $+V_o$ is achieved which is equal to half the full scale current times the resistance of the feedback resistor. The converter is shifted half scale to plus or minus of center scale. While the offset binary converter ordinarily goes from 0 to a plus full scale, shifting it half-scale results in signals going above and below the midpoint which becomes the new zero, e.g. $+I_{FSR}/2$ and $-I_{FSR}/2$.

Figure 3A:
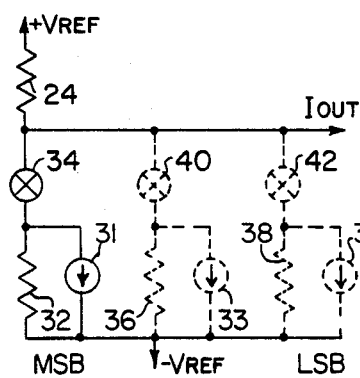
FIGS. 3A, 3B and 3C are schematic diagrams illustrating the production of the system zero and least significant bits for the offset binary system illustrated in FIG. 2 when utilized as a "zero scale" converter.
Figure 3B:
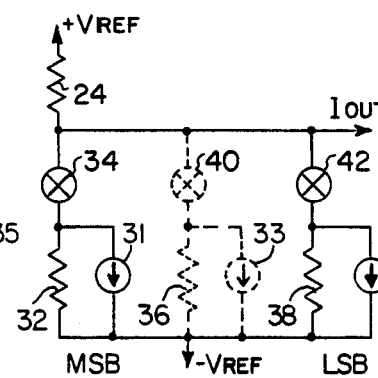
Figure 3C:
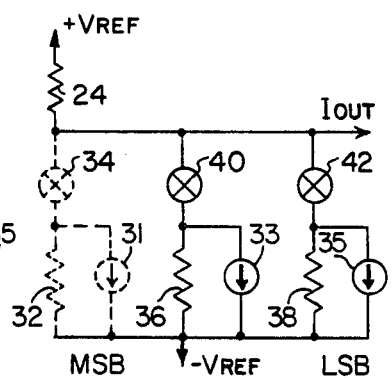

Referring now to FIGS. 3A, 3B and 3C when zero volts is required of the "zero scale" offset binary system, a current source 31 controlled by a most significant bit resistor 32 is switched into the circuit by switch 34, with resistor 32 exactly matching offset resistor 24. Thus current through the offset resistor instead of flowing into the input terminal of the operational amplifier, flows through resistor 32 such that no current flows to the operational amplifier input terminal. In order for there to be zero current at node 26, it is obvious that resistors 32 and 24 must be exceptionally evenly matched. It should be noted that the remainder of the current sources 33 and 35 controlled respectively by resistors 36 and 38 are turned OFF by respective switches 40 and 42 as illustrated by the dotted lines. The condition of the switches is denoted by the digital code 100 at the bottom of this figure.

Referring to FIG. 3B, in order to generate a voltage corresponding to a least significant bit the code 101 is utilized. This means that switch 42 is turned ON in addition to switch 34 being turned ON, such that the least significant bit is formed through the utilization of resistors 32 and 38. It will be appreciated that resistor 32 is utilized to balance resistor 24, with the least significant bit current being generated solely by resistor 38. In general, assuming resistors 32 and 24 are matched and assuming a 10% least significant bit accuracy, then resistor 38 need only have an accuracy of 10%. However, when resistor 38 is utilized to produce a negative going least significant bit voltage, its accuracy, as will be seen from FIG. 3C, must be considerably more than that which is required for producing the positive going least significant bit voltage.

Referring to FIG. 3C, the least significant bit of a negative going variety is accomplished in the offset binary system by switching ON current sources 33 and 35 via switches 40 and 42, with current source 31 being switched out of the circuit by switch 34. Thus it can be seen that the currents through resistors 36 and 38, when summed, must have a fixed relationship to offset resistor 24 and the accuracies of the bit currents must therefore be at least as high as the most significant bit resistor accuracy.

In a short, this negative LSB is generated by the MSB resistor being turned OFF and all of the rest of the resistors being turned ON. Holding tolerance on all of the remaining resistors which have been turned ON is exceedingly difficult if the required LSB accuracy is to be achieved. Here all of the turned ON resistors are balanced against the offset resistor to generate the negative LSB.

In general, it can be seen by analogy that all of the resistors in the resistor matrix utilized in the offset binary digital-to-analog converter must be of very high quality indeed, since combinations of these resistors are utilized to produce the requisite currents so that the requisite voltages may be obtained.

This is done by adjusting, or "trimming" every resistor so that it will have the correct ratio to the offset resistor to a very high accuracy. If this is not done, the step sizes for the system will not be uniform and large distortions will occur, especially at the system zero.

Figure 4:
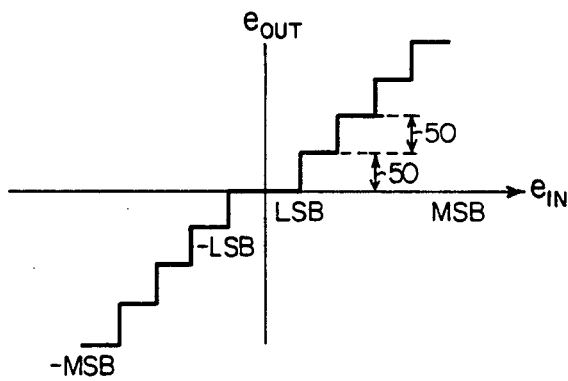
FIG. 4 is a graphical illustration of a desired step characteristic for a digital-to-analog converter.

Referring to FIG. 4, the idealized situation is for the steps to be uniform in height as designated by arrow 50, such that for a given incremental step in voltage, $e_{in}$, represented by a digital word, the incremental step in analog voltage, $e_{out}$, will always be the same. With mismatched resistors in the resistor matrix, step sizes will vary significantly especially around the zero point and elsewhere.

HIGH LINEARITY CONVERSION

Figure 5:
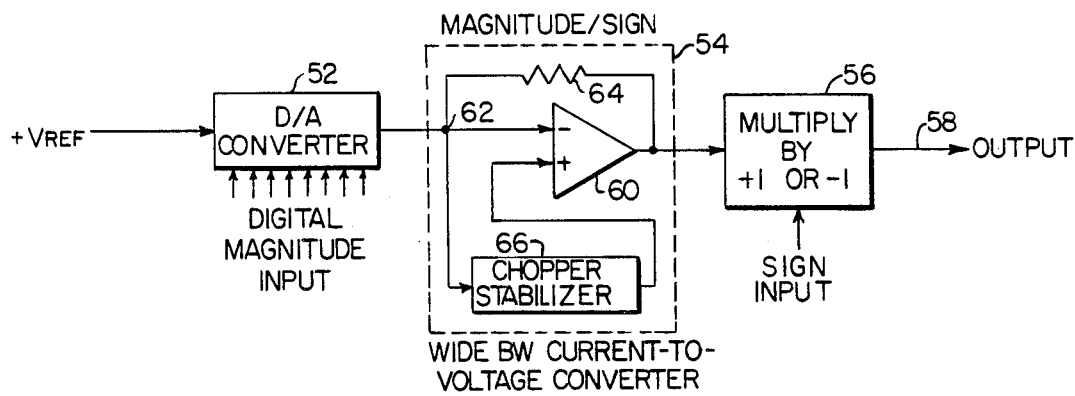
FIG. 5 is a block diagram of the subject magnitude/sign digital-to-analog converter which utilizes a unipolar digital-to-analog converter in conjunction with a wide bandwidth current-to-voltage converter coupled to a multiplier which multiplies the output of the current-to-voltage converter by +1 or -1 to obtain a bipolar output.

The above-mentioned problems are solved, as illustrated in FIG. 5, by a Magnitude/Sign digital-to-analog conversion system, in which a unidirectional single digital-to-analog converter 52 is coupled to a wide bandwidth current-to-voltage converter 54 which is in turn coupled to a multiplication circuit 56 which multiplies the output of the current-to-voltage converter by +1 or −1 to obtain a bipolar output signal on line 58. In one embodiment, digital-to-analog converter 52 is provided with a positive reference voltage $+V_R$ and is supplied with a digital magnitude input signal as illustrated by the input arrows immediately below the digital-to-analog converter. The code is such that the magnitude is described by the digital code. One bit of this code is utilized to designate whether or not the voltage to be reproduced is a positive or negative going voltage.

As such, the sign input is applied to the multiplication circuit 56 so that the output of the current-to-voltage converters may be multiplied by the appropriate quantity. Table II indicates a common magnitude/sign code.

TABLE II

| Sign Bit | Code B2 | B3 to BN-1 | BN | Output Voltage (For 16 Bits ±5 Volts) | General Equation |
|---|---|---|---|---|---|
| 1 | 1 | 1 | 1 | +4.999847 | FSR/2-LSB |
| 1 | 1 | 1 | 0 | +4.999695 | FSR/2-2LSB |
| 1 | 1 | 0 | 0 | +2.500000 | FSR/4 |
| 1 | 0 | 1 | 1 | +2.499847 | FSR/4-LSB |
| 1 | 0 | 0 | 1 | +0.000153 | +LSB |
| 1 | 0 | 0 | 0 | +0.000000 | +0 |
| 0 | 0 | 0 | 0 | −0.000000 | −0 |
| 0 | 0 | 0 | 1 | −0.000153 | −LSB |
| 0 | 0 | 1 | 1 | −2.499847 | −FSR/4+LSB |
| 0 | 1 | 0 | 0 | −2.500000 | −FSR/4 |
| 0 | 1 | 1 | 0 | −4.999695 | −FSR/2+2LSB |
| 0 | 1 | 1 | 1 | −4.999847 | −FSR/2+LSB |

The current-to-voltage converter, the main or magnitude amplifier, in general, is a wide-band operational amplifier 60 which has two input terminals. One input terminal is coupled to the output 62 of the digital-to-analog converter 52 and a feedback resistor 64 is employed between the output of the operational amplifier and output 62.

Rather than grounding the other input terminal to the operational amplifier, a DC error correcting voltage is applied to the operational amplifier which is derived from chopper stabilizer 66 or other auxiliary amplifier with an extremely low and stable offset. There is always some inherent internal DC offset voltage in any amplifier due to component mismatch, leakage, etc. It is this DC error voltage that is sensed and amplified by chopper stabilizer 66 and is applied in amplified form to the other of the input terminals of the operational amplifier to cancel the offset.

In this invention, only the DC offset is chopped. The detection of only the DC offset is accomplished by utilizing a main high gain operational amplifier, and combining the input with a small fraction of the output through a large resistor, so that any AC signal at the summing node is very small and for all practical purposes is cancelled out, leaving a residual voltage at the summing node which may be considered a DC offset voltage. It is thus this voltage which is sensed by the auxiliary amplifier and is used as an error signal to correct for the offset of the main amplifier.

Since only DC voltages are used in the chopper stabilization, offset is eliminated without affecting the bandwidth of the operational amplifier. In short, the operational amplifier maintains its original bandwidth which may be quite wide for audio applications. This chopper stabilization circuit is described more fully in FIG. 7.

Figure 6A:
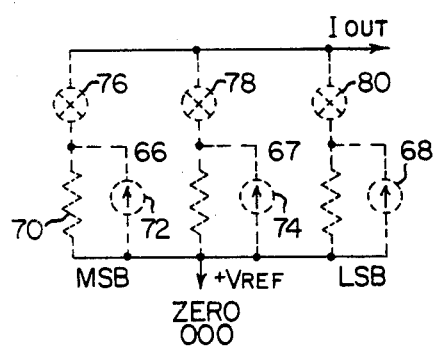
FIGS. 6A and 6B illustrate the production of the system zero and least significant bits for the system illustrated in FIG. 5.
Figure 6B:
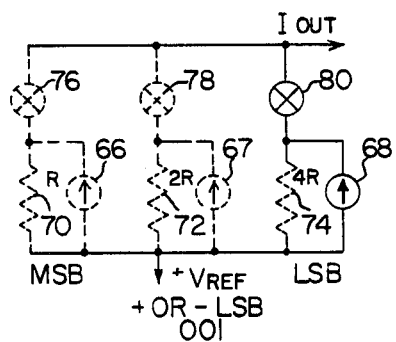

Referring now to FIGS. 6A and 6B, in operation the digital-to-analog converter 52 includes a number of current sources 66, 67 and 68 controlled respectively by resistors 70, 72 and 74 switched into the circuits respectively by switches 76, 78 and 80. In FIG. 6A, as mentioned hereinabove, in order to obtain a zero voltage, all of the switches are switched OFF. This removes current sources 66, 67 and 68 from the circuit. Therefore, no current flows through the digital-to-analog converter and output 62 is at zero. It will be appreciated that the zero for the system is thus very easily achieved by having no current flowing through the digital-to-analog converter. This is unlike the offset binary approach in which current is always flowing through the summing point even when a zero output is desired.

Referring to FIG. 6B, for either positive going or negative going least significant bits, switch 80 is activated which in turn connects current source 68 into the circuit. The current flowing through resistor 74 determines the accuracy of the least significant bit and if 0.1LSB accuracy is required for the system, the least significant bit resistor need ony have a 10% accuracy. Note that there is no balancing involved. In general, the resistor matrix for the subject system is such that for the most significant bit this resistor is given a value R. For the next most significant bit a resistor having a value 2R is provided, and for the next most significant bit, in this case the least significant bit, a resistor having a value of 4R is provided. In general, the resistor matrix is configured such that the resistor value is $R2^{n-1}$, where n is the bit number of the magnitude DAC.

OFFSET COMPENSATED AMPLIFIER

The offset voltage of an operational amplifier is the voltage differential at its inputs when its output is at zero volts. For typical monolithic amplifiers this is usually in the range of ±0.5 to ±5 millivolts. The initial value of offset can of course be trimmed out at the time the converter is manufactured, but subsequent changes cannot be compensated in this manner. High speed operational amplifiers usually employ FET type input stages, which typically change by 20 microvolts per degree C., and several millivolts per year. Amplifiers with bipolar transistor inputs are unsatisfactory due to a poor combination of input current and speed, but even these will usually change by several microvolts per degree C., and several hundred microvolts per year.

In the present invention a single chopper stabilized amplifier is used for zero offset. The composite magnitude amplifier shown in FIG. 5, and in greater detail in FIG. 7, combines a high speed main amplifier with an auxiliary chopper amplifier to produce a composite with the dynamic performance of the former, and the static DC offset performance of the latter.

Figure 7:
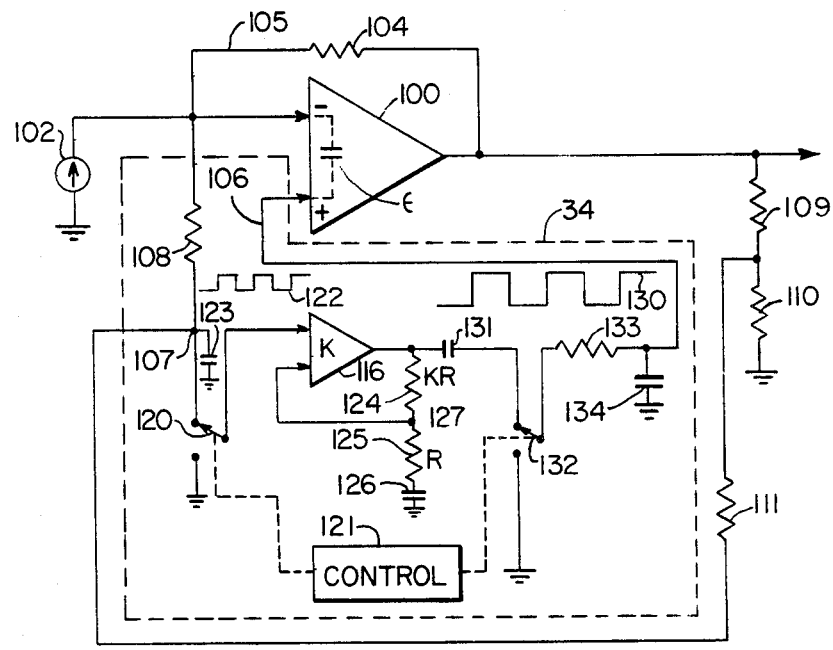
FIG. 7 is a schematic diagram of one embodiment of the chopper stabilized circuit illustrated in FIG. 5.

Referring now to FIG. 7, the chopper stabilized precision current-to-voltage converter includes an amplifier 100, which typically is a conventional wide band FET input monolithic integrated circuit operational amplifier, which might have a typical DC gain of 100,000, and a gain bandwidth product of 4 MHz. A precision feedback resistor 104 is connected from the output to the inverting input, point 105, which is also connected to the source of signal current, 102.

Alternatively, the chopper stabilized amplifier may be driven by any suitable source, and is not limited in application to digital-to-analog conversion.

Due to the negative feedback, the amplifier adjusts the voltage on its inverting input, point 105, until the net differential input voltage between 105 and noninverting input 106 is the proper value for the output voltage established by the signal current flowing from 102 through resistor 104. The net differential input consists of an offset component, which can be several millivolts, plus a signal component. The signal component is equal to the output voltage divided by the amplifier gain, and for an output of 0 to −5 volts, would typically be 0 to +50 microvolts. The net differential input voltage must appear between points 105 and 106, but it is desirable for only the signal component to be on point 105, and for the offset voltage component to appeaer on point 106.

To achieve this the chopper stabilizer is used. This is a very slow conventional inverting chopper amplifier with an input at point 107, and output connected to point 106. The chopper input point 107 is connected to main amplifier input point 105 by resistor 108, and to the output by an attenuator formed from three resistors 109, 110 and 111. One of these resistors may be selected so that the attenuation equals the gain of amplifier 100, which results in the voltage at 107 being independent of the signal component of voltage at 105. The offset component of voltage at 105 is sensed by resistor 108, is amplified at 116, inverted, and fed back to point 106. If the gain from 105 to 106 through the chopper amplifier is typically 1000, then the circuit is stable with 99.9% of the net differential offset of 100 on point 106, and only 0.1% of it on summing point 105. This residual of several microvolts can be eliminated by a trimming resistor from point 107 to a +5 volt reference (not shown).

As to the operation of the chopper stabilized amplifier, its purpose is to drive the DC voltage on point 107 to a null. To do this, the chopper stabilized amplifier includes a switch 120 which is a single pole, double throw solid state switch which chops between point 107 and ground, under the control of a control unit 121. Switch 120 forms the chopper or encoder which results in a square wave signal 122 being applied to auxiliary amplifier 116. Note, a capacitor 123 is connected between point 107 and ground to eliminate switching noise. A voltage dividing network is coupled between the output of amplifier 116 and ground and, in general, comprises resistors 124 and 125 and capacitor 126 with the midpoint 127 applied to the inverting input terminal of amplifier 116. The relative values of resistors 124 and 125 are KR and R respectively to give amplifier 116 a gain of K, since the gain of the amplifier is the ratio of KR to R. The amplified error signal from the output of amplifier 116 is illustrated by waveform 130 which is coupled across capacitor 131 to a decoding circuit comprising switch 132 similar to 120 which is driven at the same frequency as encoding switch 120. The amplified error signal which has been decoded at 132 is applied to a smoothing filter comprising resistor 133 and capacitor 134 and is thereafter applied to the non-inverting input terminal of main amplifier 100, at point 106.

By driving the non-inverting input terminal of the high gain operational amplifier 100 so as to effect a null, the component on the inverting input is reduced to zero. Since the error is driven to zero, amplifier 100 is provided with drift-free operation.

The reason for amplifying the error signal through the utilization of chopper stabilization is to accomplish readjustment of the effective offset voltage to zero.

As mentioned hereinbefore, the sensing of only DC offset basically leaves the operation of the operational amplifier alone, such that the offset cancellation circuit has virtually no effect on the signal bandwidth of the high gain amplifier. This is especially important in audio reproduction systems.

It will be appreciated that this system quickly reduces the offset error so that the operational amplifier is drift-free.

Thus the subject system is given long-term DC offset stability. It will be appreciated that any type of system which utilizes an operational amplifier as a current-to-voltage converter in which the error signal is derived as described above is within the scope of the subject invention. Thus auto zero circuits arranged in the manner described are within the scope of the subject invention.

By auto zero circuit is meant the technique of sensing the summing point input voltage of a current-to-voltage converter with a slow, very stable amplifier, and connecting the output of the slow amplifier to the other differential input of the main amplifier, so as to drive the summing point voltage to null.

SIGN MULTIPLIER

Figure 8:
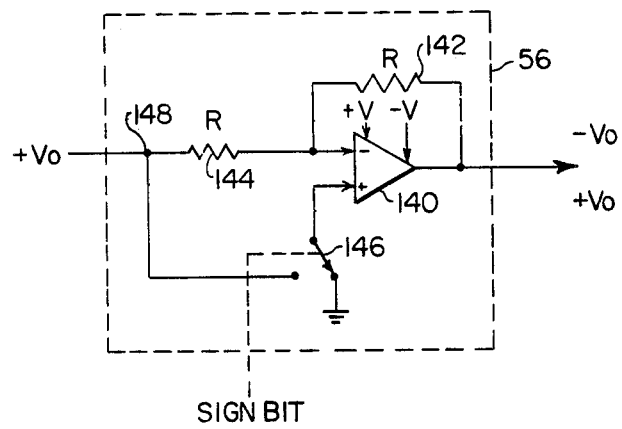
FIG. 8 is a schematic diagram of one embodiment of the multiplication circuit of the system illustrated in FIG. 5.

Referring to FIG. 8, the multiplier 56 of FIG. 5 may take on the form of an operational amplifier 140 supplied conventionally with +V and −V supply voltages, in which a feedback resistor 142 is utilized, and in which an input resistor 144 couples the unidirectional voltage from the aforementioned current-to-voltage converter to the inverting input terminal of the operational amplifier. The other input terminal of the operational amplifier is coupled to a single pole double throw solid state switch schematically illustrated at 146, one input terminal of which is grounded and the other input terminal of which is coupled to the incoming signal at 148.

It will be appreciated that the position of switch 146 determines the sign of the output signal voltage and therefore the polarity of the signal is set by the sign bit of the magnitude/sign code. If a positive voltage is required which means multiplying the unidirectional negative voltage at the input by-1, switch 146 is in the position shown. Operational amplifier 140 acts as an inverter with the input current flowing through resistor 144 also flowing through resistor 142. The amplifier inverts, producing a positive output proportional to its negative input voltage. The effective gain is determined by the ratio of resistor 142 to resistor 144.

When a negative voltage output is required, switch 146 is thrown such that the operational amplifier is actually working as a follower. In this arrangement, the input signal is coupled to the non-inverting input terminal of the amplifier.

The feedback forces the voltage on the inverting input to follow the signal applied to the non-inverting input. Thus there is no voltage drop across resistor 144, and no current flow. This requires no current flow through 142, so that the output voltage follows the input with non-inverting unity gain. Note that any offset in amplifier 140 merely affects the absolute value of the system zero and not linearity. In the applications envisaged, absolute zero operation is not necessary. Thus high linearity and large dynamic range is achieved with a minimum of parts and expense, with ±1 multiplication taking place after amplification.

EQUAL IMPEDANCE SERIES SWITCHING

The magnitude/sign architecture ensures good linearity for small output voltages, but achieving true 16 bit performance over the full output range over an extended period of time and temperature span requires that the unipolar DAC maintain 15 bit accuracy. This accuracy is achieved if the bit weights are established by the ratios of extremely stable resistors and if the temperature related effects of the switching transistors are very small and highly compensated.

One method of eliminating temperature effects of the switching transistors is to provide switching transistors whose switch resistances are binarily weighted. While this provides correct resistor ratios regardless of temperature, binary tailoring of the switches is difficult and/or costly.

As contrasted to this approach, in one embodiment, the subject invention utilizes identical switching transistors with shunt resistors to provide thermal compensation.

Figure 9:
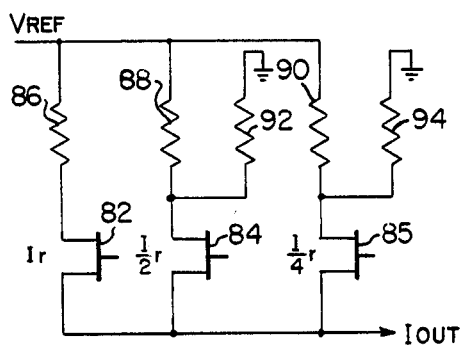
FIG. 9 is a schematic diagram of one embodiment of the resistor matrix and current switching devices in which auxiliary trimming resistors are utilized to compensate for the internal resistance of the switching devices; and, FIG. 10 is a detailed schematic diagram of one embodiment of the subject system.

The equal impedance series-switching circuit described in FIG. 9 achieves temperature compensation in a superior and less complex manner than the standard parallel bit series shunt switching converters. All of the series switch transistors are similar, matched in initial resistance and temperature coefficient. This condition is easily achieved with monolithic arrays. As the bit currents are in binary relation, with matched switches, the "ON" voltage drops in the switches are in binary relation. Therefore the voltages appearing on the precision resistors are slightly different, with the voltage on the least significant bit resistor being the largest. The current through this precision resistor is slightly in excess of the ideal binary value by an amount proportional to the difference in voltage drop in the associated switches. Detailed analysis shows that if the shunting resistor 94 is chosen to have a value that shunts away the excess current then the parallel combination of corrective shunt and precision current setting resistors will be equal to the resistance of the most significant precision resistor.

Referring to FIG. 9, the most significant precision resistor is 86, and conducts a current $I_r$ via switch 82 of resistance $R_{sw}$ and voltage $I_r R_{sw}$. The next most significant switch, 84 has half the current, and hence half the "ON" voltage, $(I_{r/2})R_{sw}$. Therefore the current through precision resistor 88 is equal to $I_{r/2}$ plus an excess of $(I_{r/2}) R_{sw}/2R$, if shunting resistor 92 has a value of 2R. As compensation is exact at any temperature at which the switches are matched, it is valid for all temperatures.

In a similar manner the current through the third bit switch, 85, causes a switch voltage of only ¼ that of switch 82. The excess current through precision resistor 90 is therefore $(3I_r R_{sw}/4)/4R$. This is shunted to ground by compensation resistor 94 of resistance 4R/3.

It may be noted that as a result of the compensating resistor the "Thevanin" equivalent circuit presented to the switching transistors for each bit consists of equal resistances with binary weighted voltage sources. The "Norton" equivalent circuit consists of binary weighted ideal current sources established by the reference voltage and precision resistors, which are all shunted by equal output resistances. Hence at any temperature at which the switch resistances match, all bits currents will maintain the proper binary weighting.

The compensating resistors limit the voltage on the "OFF" switches. For the less significant bits this is adequate to achieve most of the advantages of the conventional shunt switch so it can be eliminated. For the most significant bits, either a shunt switch or a passive shunting diode clamp may be used. The diode is simpler, and provides nearly equivalent performance.

This resistor shunting technique not only has application to the Magnitude/Sign approach described herein, but also has application to any DAC which utilizes binary weighted precision resistors. As a secondary benefit, utilizing shunt resistors eliminates the need for some of the shunt switches normally utilized in a series shunt converter such as described in U.S. Pat. No. 3,611,354. It will be appreciated that the shunt switches were utilized to maintain voltage swings across the precision resistors as low as possible. Using the shunt resistors to ground prevents excessive voltage swings on the less significant bit resistors, thereby eliminating the need for the extra shunt switches.

SYSTEM DETAILS

Figure 10:
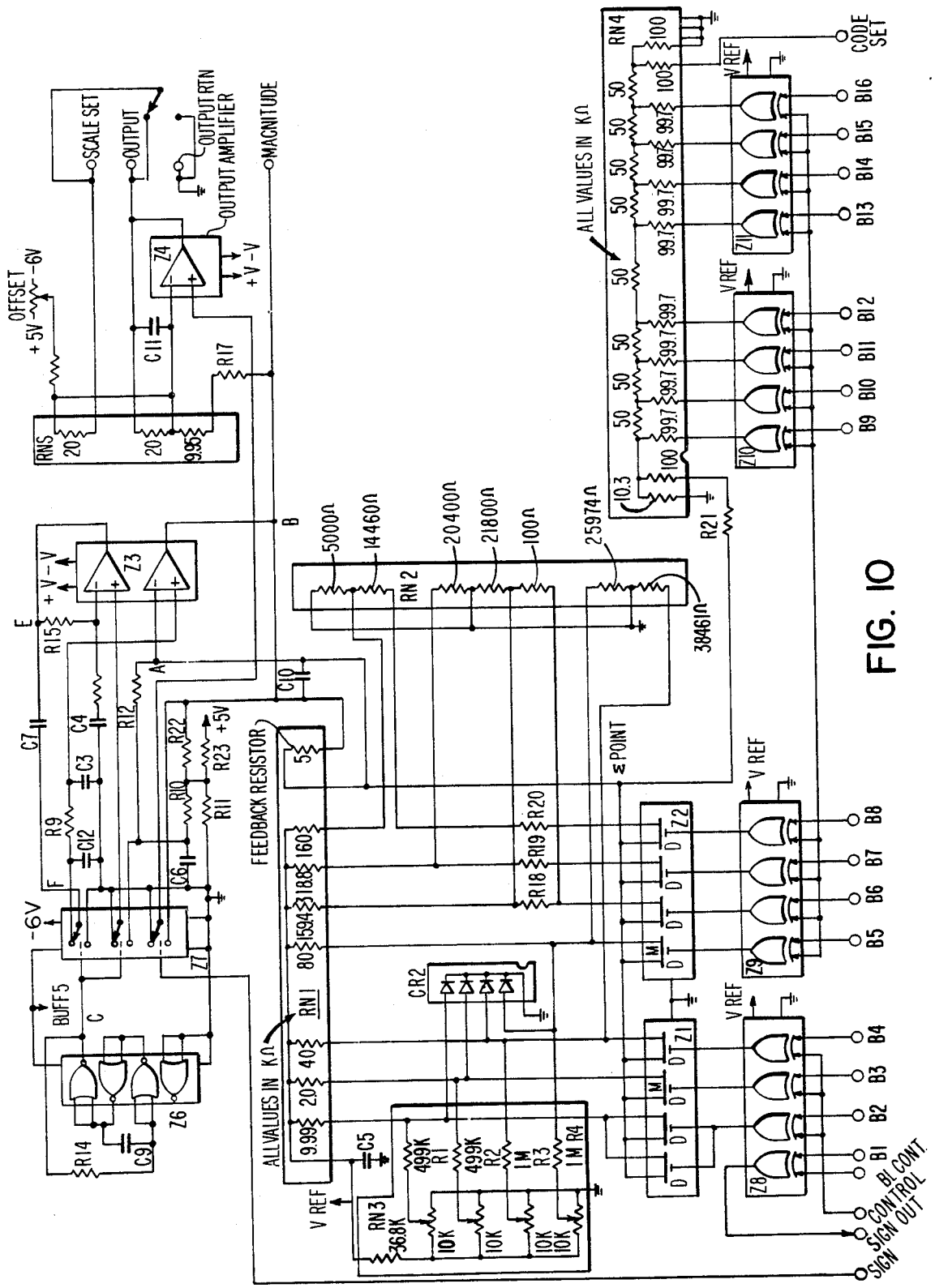

Referring now to FIG. 10, a detailed schematic diagram is provided for one embodiment of the subject digital-to-analog conversion system. In this embodiment, digital input signals are applied to one of the two input terminals of an array of 16 exclusive OR gates which are packaged four per circuit as illustrated by integrated circuit chips Z8, Z9, Z10 and Z11. These C-MOS exclusive OR gates available as RCA type 4070B. The exclusive OR gates are used both to convert the input code from 2's complement or offset binary code to a magnitude/sign code, and as voltage drivers to drive a conventional R/2R voltage driven resistor ladder, RN4. The R/2R ladder produces binary weighting for the 8 least significant bits B9-B16. Since the currents generated for the most significant bits are relatively large, more accuracy is required. Thus, with respect to most significant bits B2 through B8, the outputs of the exclusive OR gates are coupled to an array of field effect switching transistors (FETs). These switching FETs and a group of precision binary weighted resistors are connected as a 7 bit "Equal impedance series switched" DAC.

By utilizing C-MOS exclusive OR gates, and the relatively higher resistances illustrated in the RN4 resistor network, errors can be kept to a relatively low level. Note that the output of RN4 is summed with the output of RN1 at the point illustrated. The ouput of the summing point is the input to the stabilized amplifier, which in this case, is the bottom amplifier of integrated circuit chip Z3, which is available commercially as National Semiconductor LF353. Its input is at its inverting input terminal and is labeled A.

The exclusive OR gates convert the offset binary code to a sign/magnitude code as follows:

| OFFSET BINARY | | | MAGNITUDE/SIGN | | |
|---|---|---|---|---|---|
| B1 | B2 to BN-1 | BN | Sign | B2 to BN-1 | BN |
| 1 | 1 | 1 | 1 | 1 | 1 |
| 1 | 1 | 0 | 1 | 1 | 0 |
| 1 | 0 | 1 | 1 | 0 | 1 |
| 1 | 0 | 0 | 1 | 0 | 0 |
| 0 | 1 | 1 | 0 | 0 | 0 |
| 0 | 1 | 0 | 0 | 0 | 1 |
| 0 | 0 | 1 | 0 | 1 | 0 |
| 0 | 0 | 0 | 0 | 1 | 1 |

As described hereinbefore, in switching networks where a binary weighted resistance is driven, one can provide a switching resistance which is binary weighted so that any error in the switch resistance becomes merely a scale factor error. In the subject circuit, for the more significant bits, binary weighted switching networks are not utilized, but rather loading resistors, such as illustrated in RN2, are placed across the junction of the switching FETs and the binary weighted resistors. The purpose of this is that each switching FET sees a constant impedance which is nominally only slightly below 20,000 ohms, in one embodiment. What this accomplishes is that it requires that each switching FET have the same impedance rather than a scaled impedence. This is achieved by the resistors in resistor network RN2 and permits the use of matched switching FETs rather than switching FETs whose resistance varies over several orders of magnitude.

It will be appreciated that the switch resistance of RN$_2$ effectively are placed across the switching terminals of the FETs to compensate for the respective switch resistances.

The larger the ratio of precision resistor to switch resistance is, the less the currents depend upon the switch resistance. Hence for bit B2, which is the most significant bit, the effective switch resistance is reduced by a factor of ½ by employing two transistors in parallel. Effectively each of the transistors sees an equivalent source impedance equal to twice the resistance of bit B2, or equal to bit B3. Resistor network RN$_2$ presents the switches for bits B4 through B8 with an impedance equal to bit B3.

Resistor network RN$_3$ includes fixed resistors and potentiometers for trimming the effective weights of bits B2 through B5 at manufacture. Thus each FET is identical and the equivalent circuit that each FET sees is in each case 20,000 ohms per bit.

It will be appreciated that in order to keep the precision resistance from becoming excessive, bit 8 uses a smaller resistance and a current divider which is illustrated at the upper part of resistor network RN$_2$. Also, with the FET switches OFF, the voltage across them for the B2 through B5 bits is clamped to no more than one diode drop by an array of diodes CR$_2$. This increases the speed of the circuit because the voltage across the FETs which must be moved need not be a large voltage. With a minimized voltage swing at the switch points, the switches react with greater speed.

It will be noted that a 17th input bit is provided at the CODE SET terminal. When this point is connected to logical "1", i.e. the +5 volt reference, it increments the output of the "Magnitude" amplifier by exactly ½ LSB. This is useful when it is desired to have full 16 bit resolution at the magnitude output, or as an aid in the code conversion processes.

The magnitude/sign internal code has two "zero" codes, i.e. +0 and −0, but offset binary or 2's complememt each have only one code for zero. The exclusive OR gates act in a 1's complement mode, passing positive codes unchanged, while complementing all the LSB's for negative codes. Hence an input of −1 is complemented and converted to an internal code of −0.

To avoid having two different input codes produce equal outputs, the CODE SET input is connected high whenever offset binary or 2's complement codes are employed. This increases the magnitude of the output by ½ LSB. Positive outputs are more positive, and negative codes are more negative. An input code of zero causes a +½ LSB output and an input of −1 causes an output of −½ LSB. Note that the difference is exactly 1 LSB as required. The offset of ½ LSB for all codes can be easily corrected with the offset adjust potentiometer.

Note that the output of the B1 exclusive OR gate is the SIGN OUT signal, which is applied not only to the multiplier but is also used as the control signal to allow the exclusive OR gates to convert from 2's complement to sign/magnitude.

Note also that for the B9-B16 bits the exclusive OR gates are part of the associated voltage switch whereas for the B2-B8 bits, the FETs form part of the associated current source.

All of the R/2R ladder resistors and the binary weighted resistors are switched to produce a net current which is directly proportional to the digital word input. It is that current flows out of point A which is the input to the chopper stabilized amplifier.

Referring to the bottom half of Z3, the current at point A is counter-balanced by feedback current from the feedback resistor which is the 5K resistor of resistor network RN$_1$. Therefore, the summing junction is held at a true virtual ground. The magnitude output of the stabilized amplifier at B, is directly proportional to the digital input current or level. The magnitude output of the stabilized amplifier is applied to output amplifier Z4, which is either configured as an inverting amplifier or a non-inverting amplifier with a nominal gain of either one or two depending on the scaling set. In one embodiment, this amplifier is available as National Semi-conductor model LF356. The scaling set is accomplished by resistor network RN$_5$ as will be described later. The input signal to the stabilized amplifier is switched by a section of triple multiplexer (mux) Z7. Depending on the switch position of the lower switch in this mux, the output amplifier Z4 reacts either as a follower or as an inverter. In either case, the impedance seen by the mux is virtually infinite and therefore the mux introduces no measurable errors.

The chopper is controlled by a square wave pulse generator Z6 which in the embodiment illustrated, includes three inverters with positive and negative feedback which produces a square wave of approximately 20 hertz. As illustrated, this is utilized to drive two of the sections of the multiplexing circuit. The square wave signal is applied at point C to the mux.

Note that the square wave is applied to two of the three control inputs to the mux. The other control input is applied or coupled to the SIGN OUT line from the first exclusive OR gate.

In one embodiment, the mux may be a CD4053 which is C-MOS triple single pole double throw switch.

In operation, the voltage on summing point A is sampled through resistor R12 and is then applied to the lower section of the mux. Prior to that it is first filtered so that any charge injected by the mux does not reach back into the summing point. The filter is provided by C6 and R12 such that the voltage on the input to the mux and hence on C6 is a dc offset voltage. The mux switches back and forth between this voltage and ground and produces a voltage on the high gain section of Z3 at the positive input terminal to the high gain section. At the positive input terminal of this amplifier, there is square wave switching between the offset voltage at the summing point and ground. This section of the amplifier is configured to be a very high gain positive gain amplifier with a nominal gain of approximately 2,000 at the signal frequency at which the chopper operates. Out of this amplifier is an amplified version of the offset voltage at the summing point. This exists at point E. The voltage at point E is AC coupled and demodulated by the third or uppermost section of the mux to produce a dc voltage which is approximately 1,000 times the offset voltage at the summing point. The voltage exists at point F.

The voltage at point F is filtered by C12, R9 and C3 to produce a dc voltage which has a very low ripple and which is fed back to the non-inverting input of Z3.

The gain of output amplifier Z4 may be simply controlled or scaled by the utilization of a 20K resistor in the RN$_5$ network. The scale set is accomplished by manually switching the scale set output pin to either ground or the output terminal of output amplifier Z4, such that when the scale set is connected to the output pin the nominal gain of the amplifier is one, whereas in the other position, the nominal gain of the amplifier is 2. It will be appreciated that scale set does not affect the operation of the amplifier in terms of functioning as a follower in one case and as an inverter in the other. The scale factor therefore gives an output full scale range of either +10 volts or +20 volts, for outputs of ±5 volts or ±10 volts, respectively.

The offset of output amplifier Z4 may be compensated for by means of a resistor and potentiometer connected to one of its inputs.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A digital-to-analog converter utilizing a magnitude/sign input code comprising in combination:
    unipolar means for converting the magnitude portion of the digital input code into a corresponding analog input signal;
    a broad bandwidth amplifier circuit for developing an amplified analog signal at the output thereof, said broad bandwidth amplifier circuit having two inputs, one of said inputs being permanently coupled to the output of said unipolar converting means, said circuit having means for minimizing any AC signal present at said one input of said broadband amplifier circuit;
    a chopper-stabilized amplifier coupled to the inputs to said broad bandwidth amplifier circuit, said chopper-stabilized amplifier including means coupled to said one input for developing an error signal by sensing substantially only the DC offset of said broad bandwidth amplifier circuit, said error signal being coupled to the other of said inputs of said broad bandwidth amplifier circuit; and
    means for multiplying the amplified analog signal by +1 or −1 responsive to the sign bit of the digital input code.

2. The converter of claim 1 wherein said minimizing means includes a feedback resistor coupled between the output of said broad bandwidth amplifier circuit and said one input thereby to form a summing node; a resistor coupled at one end to said summing node; said chopper-stabilized amplifier including means coupled to the other end of said resistor for chopping, amplifying and demodulating the signal at said summing node and for applying said demodulated signal to the other of said inputs; and an attenuating feedback loop from the output of said broad bandwidth amplifier circuit to the other end of said resistor, said feedback loop having an attenuation equal to the open loop gain of said broad bandwidth amplifier circuit such that the voltage at the other end of said resistor is independent of the signal component at said summing node, whereby only a signal reflecting the offset of said broad bandwidth amplifier circuit is chopped and fed back as an error signal.

3. The converter of claim 1 wherein said multiplying means includes an operational amplifier having two inputs, an output, and a supply of positive and negative voltage; a feedback resistor between said output and one of said inputs; an input terminal; a resistor connected between said input terminal and said one input of said operational amplifier; and, means for selectively connecting the other of said inputs of said operational amplifier to ground or to said input terminal responsive to the state of said sign bit.

4. The converter of claim 1 wherein said minimizing means includes a high gain amplifier.

* * * * *